(12) United States Patent
Takanashi

(10) Patent No.: US 7,509,557 B2
(45) Date of Patent: Mar. 24, 2009

(54) DE-INTERLEAVER, MOBILE COMMUNICATION TERMINAL, AND DE-INTERLEAVING METHOD

(75) Inventor: Mitsunori Takanashi, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 613 days.

(21) Appl. No.: 11/166,151

(22) Filed: Jun. 27, 2005

(65) Prior Publication Data

US 2005/0286612 A1    Dec. 29, 2005

(30) Foreign Application Priority Data

Jun. 28, 2004    (JP) .............................. 2004-189433

(51) Int. Cl.
 *H03M 13/00* (2006.01)
(52) U.S. Cl. ...................... 714/755; 714/801
(58) Field of Classification Search .............. 714/755, 714/801
 See application file for complete search history.

(56) References Cited

U.S. PATENT DOCUMENTS

2003/0014700 A1* 1/2003 Giulietti et al. ............. 714/701
2005/0028065 A1* 2/2005 Halter ......................... 714/755
2005/0071729 A1* 3/2005 Kim ............................ 714/755
2005/0135493 A1* 6/2005 Maltsev et al. .............. 375/260
2006/0107163 A1* 5/2006 Obuchi et al. ............... 714/746

FOREIGN PATENT DOCUMENTS

| JP | 3239872 | 10/2001 |
|---|---|---|
| JP | 2004-147240 | 5/2004 |

* cited by examiner

Primary Examiner—Jacques H Louis-Jacques
Assistant Examiner—Sam Rizk
(74) Attorney, Agent, or Firm—McGinn IP Law Group, PLLC

(57) ABSTRACT

A de-interleaver has a TTI frame buffer storing a TTI frame before de-interleaving, a P bit information table storing P bit information containing the size and added position of P bits to be added to the TTI frame before de-interleaving, and a permutation rule table storing permutation rules of de-interleaving. The de-interleaver performs de-interleaving on the data stored in the TTI frame buffer based on the P bit information stored in the P bit information table and the permutation rules stored in the permutation rule table.

10 Claims, 7 Drawing Sheets

16

| A(1, 0) | 0 |
|---|---|

| A(2, 0) | 0 |
|---|---|
| A(2, 1) | 1 |

| A(4, 0) | 0 |
|---|---|
| A(4, 1) | 2 |
| A(4, 2) | 1 |
| A(4, 3) | 3 |

| A(8, 0) | 0 |
|---|---|
| A(8, 1) | 4 |
| A(8, 2) | 2 |
| A(8, 3) | 6 |
| A(8, 4) | 1 |
| A(8, 5) | 3 |
| A(8, 6) | 5 |
| A(8, 7) | 7 |

Fig. 5

DE-INTERLEAVER, MOBILE COMMUNICATION TERMINAL, AND DE-INTERLEAVING METHOD

BACKGROUND OF THE INVENTION

1. Field of the Invention

The present invention relates to a de-interleaver used for error correction at a receiver in radio communications, a de-interleaving method, and a mobile communication terminal having the de-interleaver.

2. Description of Related Art

Interleaving is performed in radio communications in order to spread burst errors generated by phasing or the like. When transmitting encoded data, a transmitter performs interleaving that reorders a data stream to be transmitted. Then, a receiver performs de-interleaving that rearranges the received data stream back in the original order and decodes the data stream after that. This process converts burst errors into spread random errors, thereby increasing the error correction capability.

Interleaving process within wideband code division multiple access (W-CDMA) is defined in 3rd Generation Partnership Project (3GPP)-TS25.212. It specifies that a transmitter performs first interleaving on a data stream where one transport channel (TrCH) has been encoded. The first interleaving process changes the order of data bits in a transmission time interval (TTI) frame, which is a unit of transmission over a TrCH. Further, TS25.212 specifies to perform rate matching prior to first interleaving and to segment the TTI frame into radio frames (10 ms), which is a unit of radio transmission, after first interleaving.

Rate matching involves the process to reduce the number of bits contained in a TrCH. The processing mode for reducing the number of bits is called compressed mode. The compressed mode is to turn off transmissions temporarily to create transmission gaps when transmitting data from a transmitter (e.g., a base station) to a receiver (e.g., a mobile communication terminal). The transmission idle time obtained by the transmission gaps is used to measure the frequency of a handover target channel upon handover to a different frequency.

One method for creating transmission gaps in the compressed mode is called compressed mode by puncturing. Puncturing creates transmission gaps by decimating data bits on a TrCH. If rate matching specifies the implementation of puncturing, a process to remove data bits corresponding to a transmission gap from a TrCH is performed.

The first interleaving process that is performed on the TrCH after puncturing is performed as follows. First, the process inserts redundant bits (P bits) of the same number as the bits reduced by puncturing into a TTI frame which is not interleaved. Then, it interleaves the data stream where the P bits are inserted. The P bits are inserted so that they are positioned at the beginning of radio frames when the interleaved TTI frame is segmented into radio frames.

After first interleaving, the process segments the TrCH into radio frames, subsequently performs multiplexing which is specified in TS25.212, and then transmits the radio frames to a receiver. The P bits positioned at the beginning of the radio frames are removed prior to the transmission so that transmission gaps are created between the radio frames to be transmitted.

On the other hand, when performing de-interleaving in a receiver, it is necessary to implement the reverse process to the first interleaving process performed in the transmitter. This process is called first de-interleaving. FIG. 8 shows a configuration example of a conventional first de-interleaver 800 when puncturing is implemented. The first de-interleaving operation is described with reference to FIG. 8. Specifically, a radio frame concatenation and P bit insertion section 82 reads received radio frames from a radio frame buffer 81 and inserts a P bit at the beginning of the radio frame.

When inserting the P bit, the number of P bits to be inserted into the TTI frame is read out from a P bit information table 86. The number of P bits to be inserted is the same as the number of P bits inserted in the first interleaving process at a transmitter. The number is notified by a base station in the transmitter and stored in the P bit information table in advance.

Then, a de-interleaving section 83 performs de-interleaving on the frame data to which the P bit has been inserted according to permutation rules set by a permutation rule table 87. The permutation rule table 87 retains the permutation rules predetermined according to the length of the TTI frame. The de-interleaving section 83 performs de-interleaving according to the permutation rules stored in the permutation rule table 87 and stores the de-interleaved frame to a TTI frame buffer 84.

After that, a P bit removal section 85 removes all the P bits from the data stored in the TTI frame buffer 84 and sends the data to a decoding block in a subsequent stage.

De-interleavers and de-interleaving methods which reduce the memory buffer capacity required for de-interleaving have been proposed. They are described in Japanese Patent No. 3239872 and Japanese Unexamined Patent Publication No. 2004-147240, for example.

However, the present invention has recognized that, in the conventional first deinterleaver 800 described with reference to FIG. 8, the TTI frame buffer 84 that stores de-interleaved TTI frames requires as much capacity as storing all the TTI frames where P bits are added. It is therefore necessary to have a buffer memory of a large capacity to store P bits, which are merely redundant bits.

SUMMARY OF THE INVENTION

According to one aspect of the present invention, there is provided a de-interleaver for restoring interleaved data, including a data storage section storing data before de-interleaving, a first storage section storing additional data information containing a size and an added position of additional data to the data before de-interleaving, and a second storage section storing a permutation rule. The de-interleaver performs de-interleaving on the data stored in the data storage section based on the additional data information stored in the first storage section and the permutation rule stored in the second storage section.

This configuration allows performing de-interleaving using additional data information without actually inputting additional data such as P bits. This eliminates the need for a buffer to store additional data such as P bits and thereby reduces a buffer capacity necessary for a de-interleaver.

According to one aspect of the present invention, there is provided a de-interleaving method for de-interleaving received data in a wideband code division multiple access (W-CDMA) system, including acquiring additional data information indicating a transmission gap length and containing a size and an added position of additional data to be added to the received data, determining an output sequence of the received data after de-interleaving based on the additional data information and a predetermined permutation rule, and outputting the received data according to the determined output sequence.

This method allows performing de-interleaving using additional data information without actually inputting and outputting additional data. This eliminates the need for a buffer memory to store additional data and thereby reduces a buffer capacity necessary for de-interleaving.

BRIEF DESCRIPTION OF THE DRAWINGS

The above and other objects, advantages and features of the present invention will be more apparent from the following description taken in conjunction with the accompanying drawings, in which:

FIG. 5 is a view showing an example of a permutation rule table;

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed. It is noted that in the description of the drawings the same elements will be denoted by the same reference symbols and redundant description will be omitted.

First Embodiment

Figure 1:
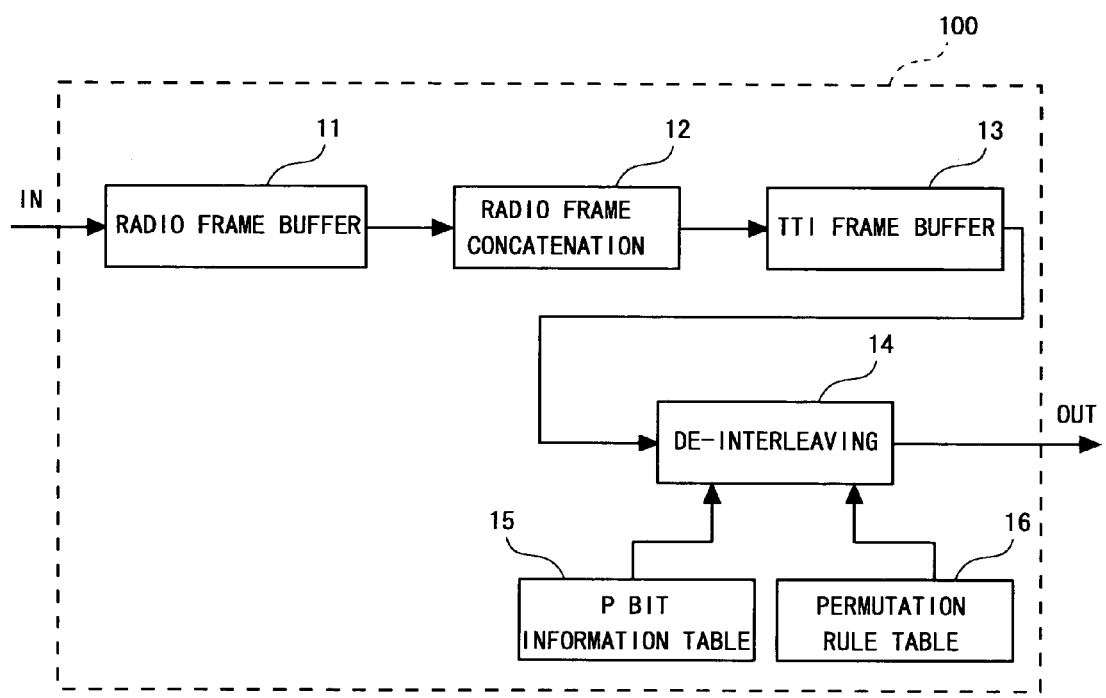
FIG. 1 is a block diagram of a first de-interleaver of the present invention.

FIG. 1 shows a configuration of a first de-interleaver 100 according to one embodiment of the invention. A radio frame buffer 11 is a memory to store radio frames input from an external device such as a second de-interleaver performing second de-interleaving before radio frame concatenation. A radio frame concatenation section 12 is an operation part to concatenate the radio frames stored in the radio frame buffer 11 to form a TTI frame. The formed TTI frame is stored in a TTI frame buffer 13 which corresponds to the data storage section of claim 1. Unlike the conventional first de-interleaver 800, the first de-interleaver 100 does not add P-bits.

A de-interleaving section 14 reads the number of P bits to be inserted into a TTI frame to be de-interleaved from a P bit information table 15 which corresponds to the first storage section of claim 1, also reads bits permutation rules from a permutation rule table 16 which corresponds to second storage section of claim 1, and then permutates the bits of the TTI frame according to a processing flow described later. The TTI frame after permutation is output to the outside of the first de-interleaver 100. Specifically, it is output to a decoding block for decoding the first de-interleaved TTI frame.

Figure 2:
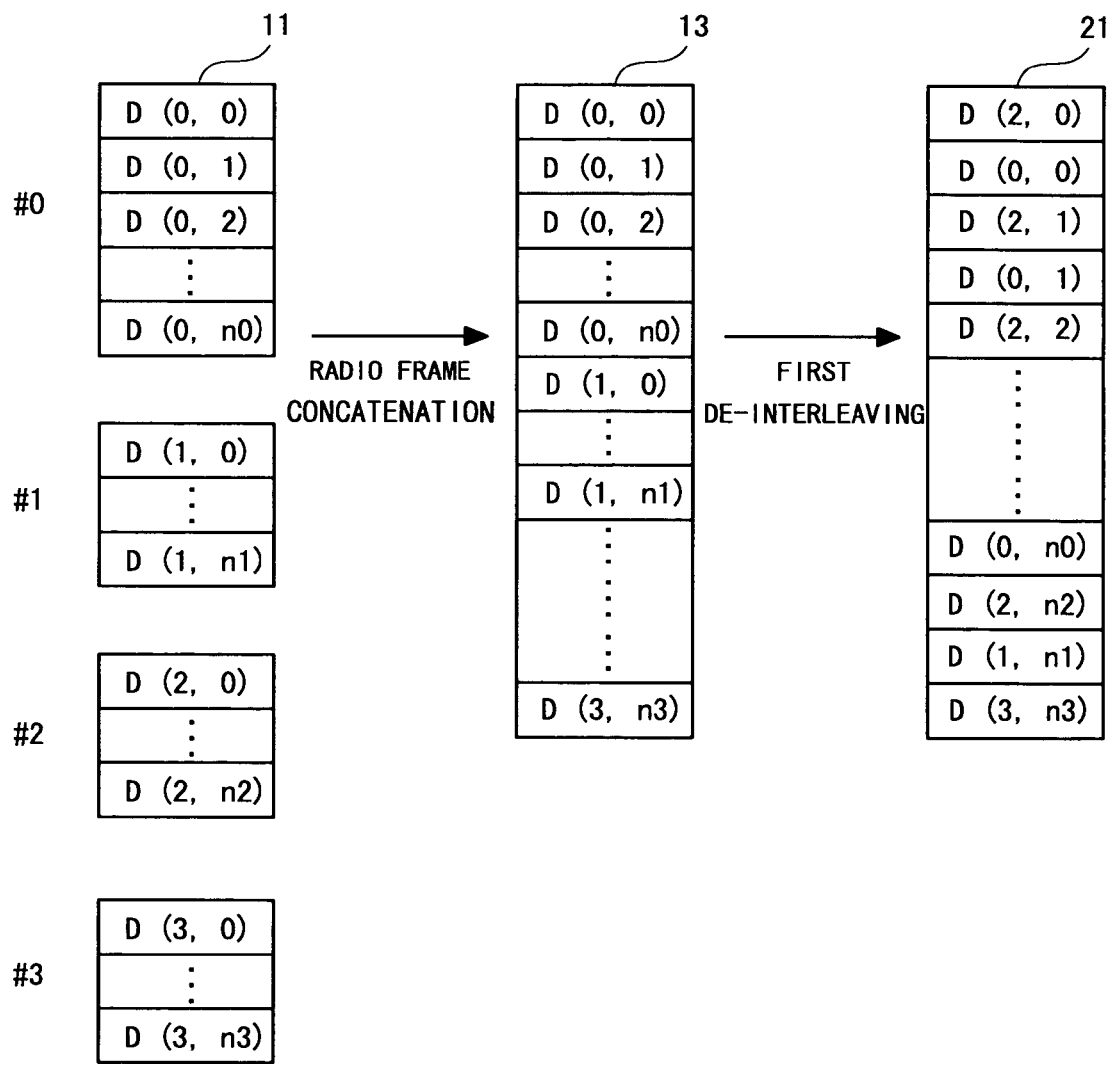
FIG. 2 is a view showing the data to be stored in a buffer of a first de-interleaver of the present invention.

The effect of reducing a buffer capacity in the present invention is described hereinafter with reference to FIGS. 2 and 3. FIG. 2 shows the data stored in each buffer of the first de-interleaver 100. In FIG. 2, D(i, j) indicates a data bit with "i" corresponding to a radio frame number and "j" corresponding to a bit number assigned sequentially in a radio frame. On the other hand, P(i, j) indicates a P bit. FIG. 2 shows the case where a TTI length is 40 ms so that four radio frames are concatenated to form one TTI frame.

The radio frame buffer 11 of FIG. 2 stores radio frames input from an external device. The radio frames in the radio frame buffer 11 are sequentially output to the TTI frame buffer 13, and the TTI frame buffer 13 stores a TTI frame formed by four radio frames (#0 to #3). Since the de-interleaver 100 of this invention does not insert P bits, a size of the TTI frame buffer 13 may be such that it can store all the bits of the radio frames #0 to #3. An external frame buffer 21 stores the data output from the de-interleaving section 14. For example, it may be the data stored in a frame buffer of a decoding block or the like which is placed outside the first de-interleaver 100. The external frame buffer 21 of FIG. 2 is merely an example, and it does not necessarily have a size corresponding to TTI. In practice, the external frame buffer 21 may have a buffer capacity corresponding to a unit of decoding, such as turbo-decoding and Viterbi-decoding, in a decoding block of a subsequent stage. In this case, the output of the de-interleaver 100 may be in accordance with a unit of decoding to be performed in the decoding block of the subsequent stage.

Figure 3:
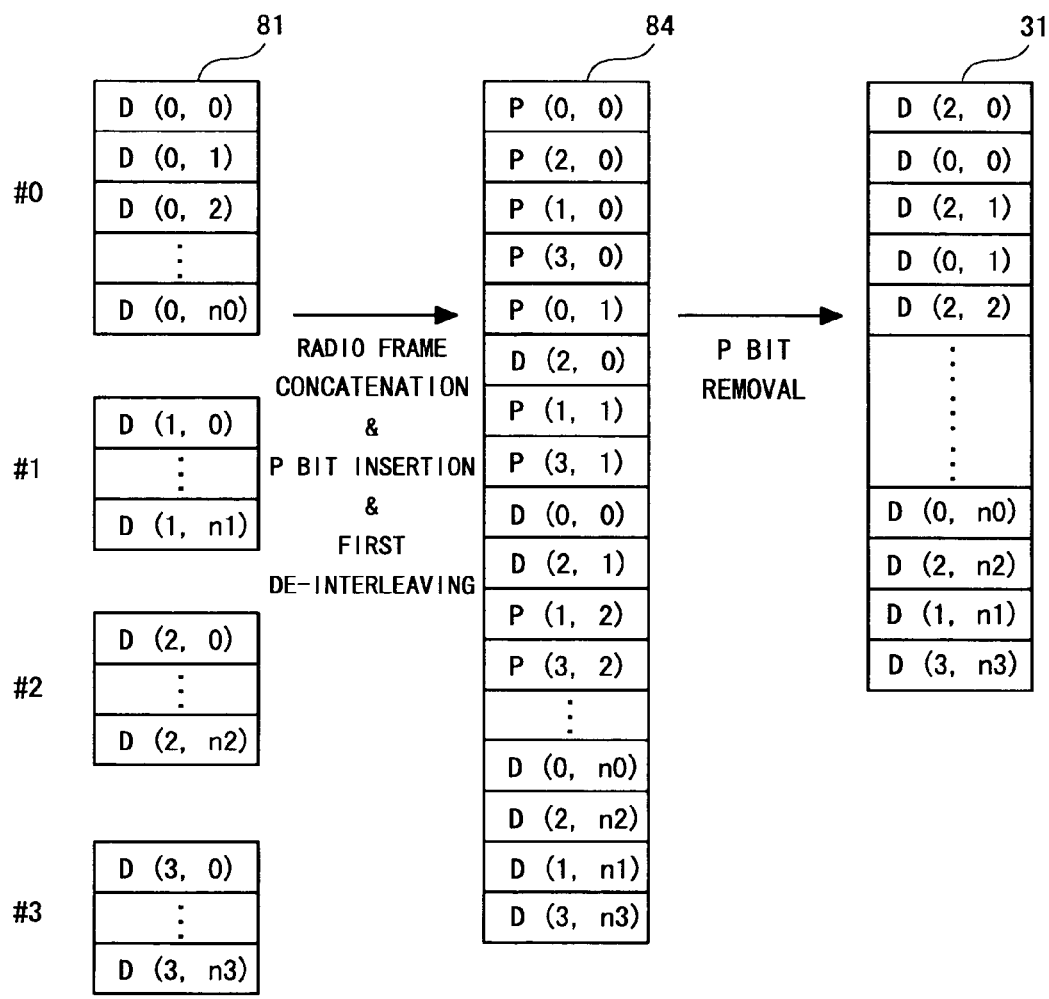
FIG. 3 is a view showing the data to be stored in a buffer of a conventional first de-interleaver.

On the other hand, FIG. 3 shows the data stored in each buffer of the conventional first de-interleaver 800. Just like FIG. 2, it shows the case where a TTI length is 40 ms. An external frame buffer 31 stores the data output from the P bit removal section 85. For example, it may be the data stored in a frame buffer of a decoding block or the like which is placed outside the first de-interleaver 800. As shown in FIG. 3, since the first de-interleaved data stored in the TTI frame buffer 84 contains P bits, the buffer size needs to be larger than the TTI frame buffer 13 of this invention shown in FIG. 2 by the number of P bits.

Specifically, if TTI is a maximum of 80 ms and the normalized input data is 8 bit (1 byte), P bits of up to 63,840 bytes can be inserted to data of up to 33,792 bytes. It is thereby necessary for the conventional TTI frame buffer 84 to have a buffer capacity of as large as 97,632 bytes at maximum for each TTI frame. On the other hand, since the need for storing 63,840 bytes for P bits is eliminated in this invention, it is sufficient for the TTI frame buffer 13 to have a capacity for storing data of up to 33,792 bytes for each TTI frame. It is thereby possible to significantly reduce a necessary buffer capacity.

Figure 6:
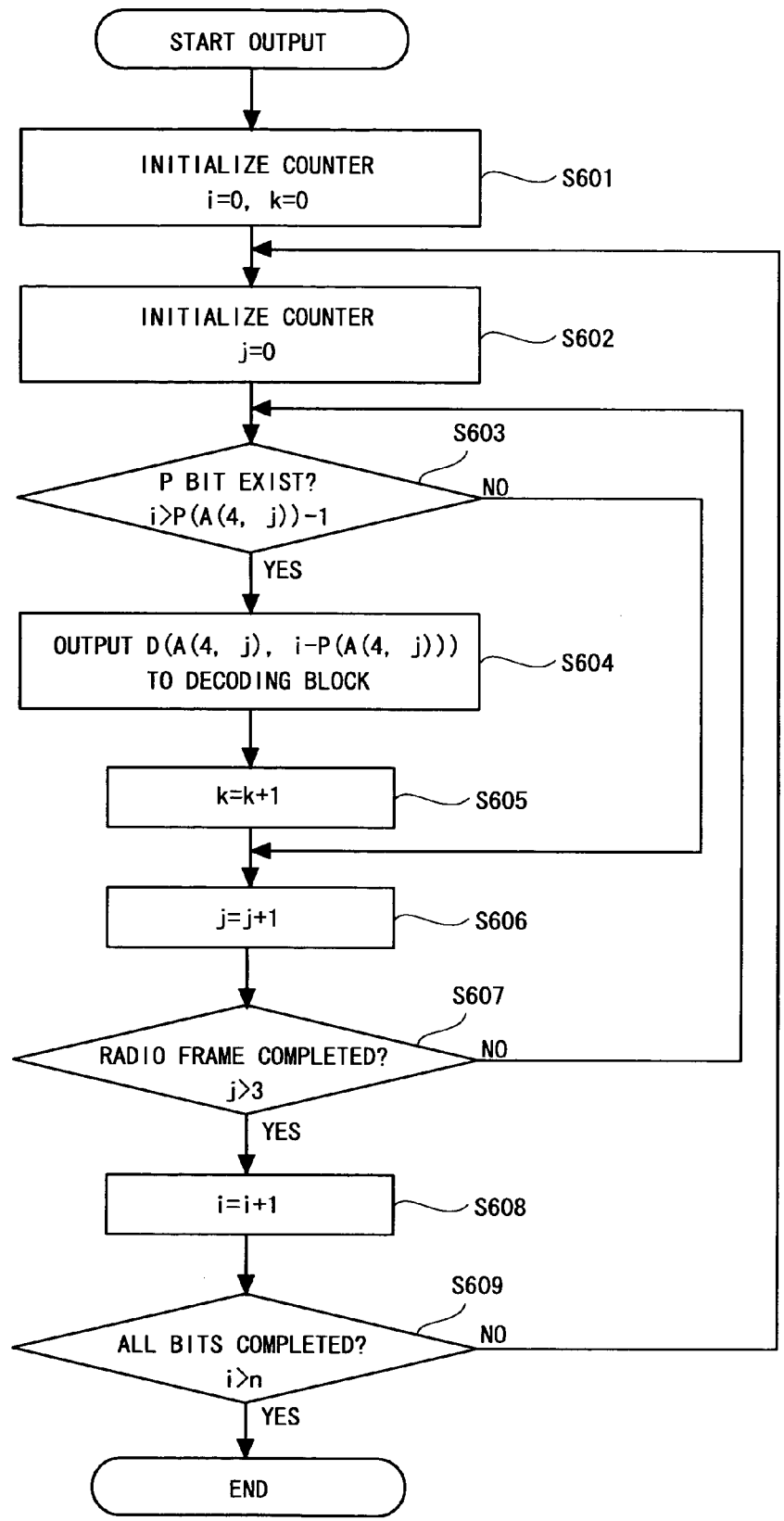
FIG. 6 is a processing flow diagram of a de-interleaving process of the present invention.

The processing performed in the de-interleaving section 14 is detailed hereinafter with reference to FIGS. 4 to 6. The following description describes as an example the case where a TTI length is 40 ms, that is, four radio frames are combined to form one TTI frame.

Figure 4:
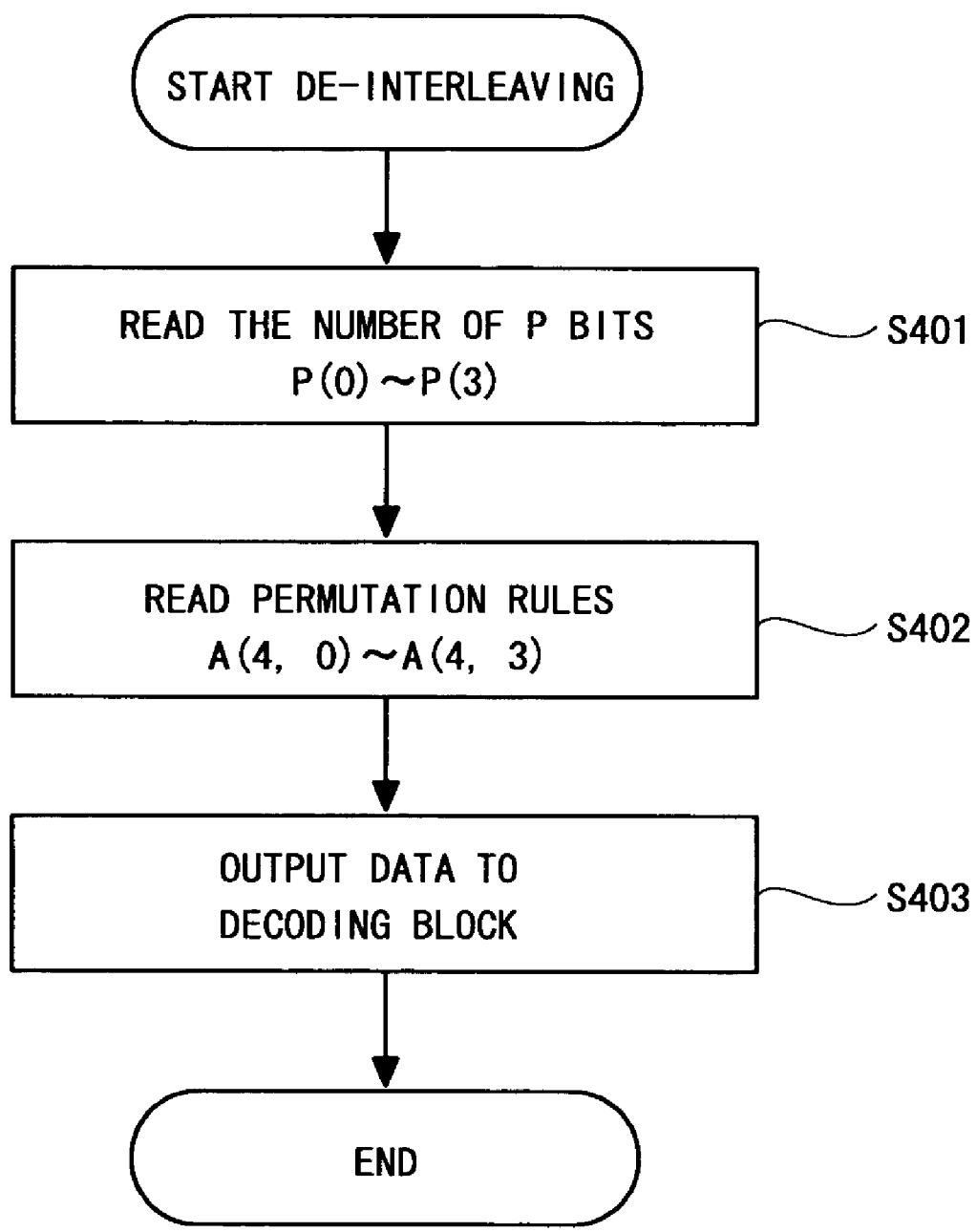
FIG. 4 is a processing flow diagram of a de-interleaving process of the present invention.

FIG. 4 is a flowchart of a de-interleaving process. The process begins with Step S401 reading the number of P bits to be inserted into the present TTI frame from the P bit information table 15. P(i) shown in FIG. 4 indicates the number of P bits to be inserted into the i-th radio frame of the present TTI frame. If a TTI length is 40 ms, "i" is each of four values from 0 to 3. Since the number of P bits to be inserted is notified by a base station or the like of a transmitter just like conventional cases, the number of P bits transmitted from the transmitter may be stored in the P bit information table 15 in advance.

Then, Step S402 reads bits permutation rules for the case where a TTI length is 40 ms from the permutation rule table 16. The permutation rules which specify rules for bit displacement in first de-interleaving are determined according to the TTI length, and they are defined in the 3GPP-TS25.212. Therefore, the permutation rule table 16 may store the values predetermined by the sequence A(i, j) shown in FIG. 5, for example. In FIG. 5, the value at the right side of A(i, j) indicates a bit position after de-interleaving, "i" is the value indicating a TTI length with a multiple of a radio frame (10 ms), and "j" is the number indicating a bit position before de-interleaving. Since a TTI length is 40 ms in this case, four values of A(4,0)=0, A(4,1)=2, A(4,2)=1, and A(4,3)=3 are read out for use.

Step S403 changes the order of data bits in the TTI frame buffer in consideration of the presence of P bits by using the number of P bits and the permutation rules read out above, and outputs the reordered values to an external device such as a decoding block. A specific example of this step is described hereinafter with reference to FIG. 6.

First, Steps S601 and S602 initialize counters i, j, and k which are used in a subsequent process. The counter i is used to count up all the bits in a radio frame. The counter k indicates the output sequence of de-interleaved data and assigns the numbers sequentially from 0 for initial output data. Then, a series of process from Steps S602 to S608 is repeated on all the bits from the start bit (0) to the final bit (n) of a radio frame.

Step S602 initializes the counter j. The counter j counts up the number of radio frames. The loop process from S603 to S607 repeats the processing on four radio frames to which the numbers 0 to 3 are assigned. Step S603 determines if a P bit to be inserted to the start position of the radio frame exists. For example, when the loop process is started from where i=0 and j=0, if P(0) which indicates the number of P bits to be inserted into the 0th radio frame is 1 or more, the process does not perform Steps S604 to S605 and proceeds to Step S606 to perform count-up with the counter j. This is because, when a target of bit permutation is a P bit, there is no need to output the target bit to an external device such as a decoding block.

If, on the other hand, P(0) that indicates the number of P bits is 0, Step S604 reads out the value of D(A(4, 0), 0), which is D(0, 0) from the TTI frame buffer 13, and outputs the value to an external device such as a decoding block. Step S605 counts up the value of k for the next output since the previous step has performed the data output.

The above series of process is repeated on each of the four radio frames (S607) and further repeated up to the final bit of the radio frame by counting up the counter i (S608 and S609), thereby outputting the first de-interleaved TTI frame to an external device such as a decoding block.

Figure 7:
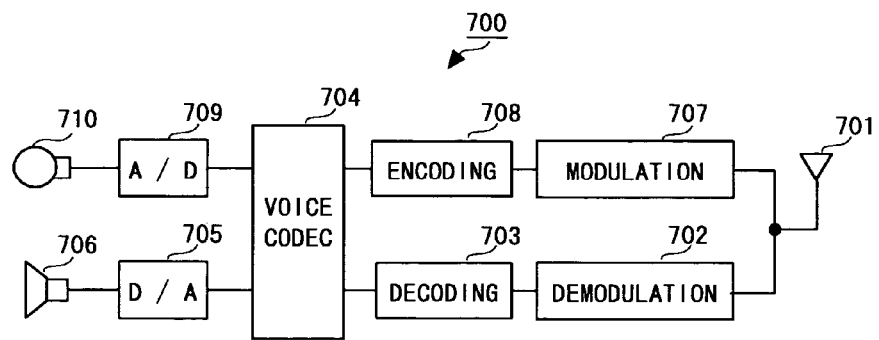
FIG. 7 is a block diagram of a mobile communication terminal of the present invention.
Figure 8:
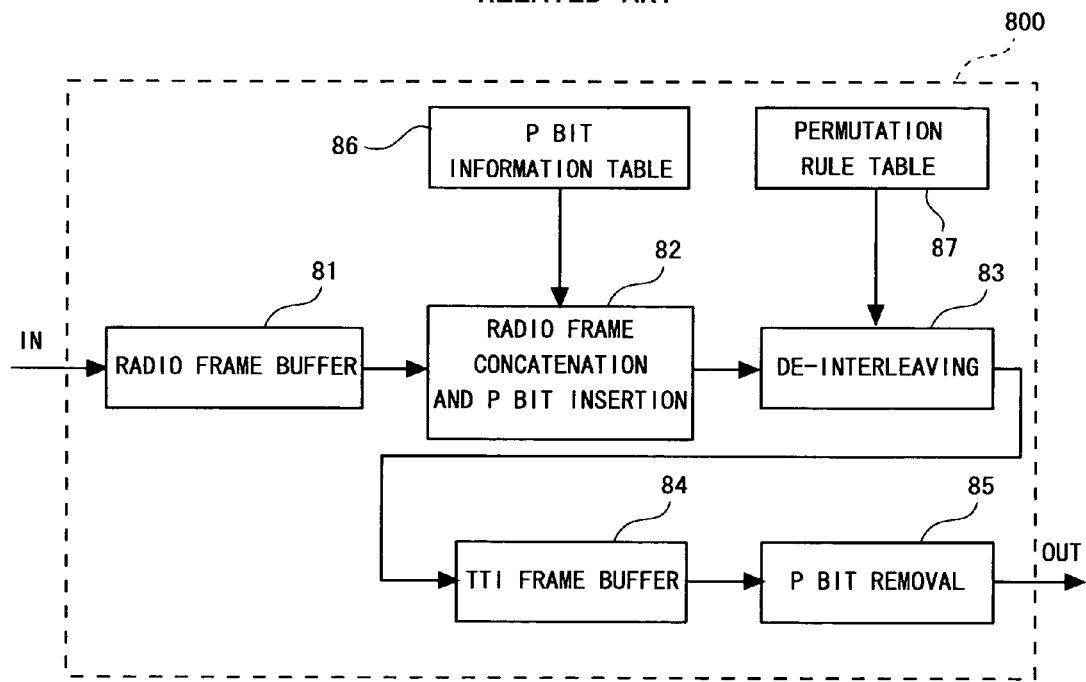
FIG. 8 is a block diagram of a conventional first de-interleaver.

The first de-interleaver 100 described above may be used for a radio receiver such as a mobile communication terminal in a W-CDMA system. FIG. 7 shows an example of the mobile communication terminal having the first de-interleaver 100. The mobile communication terminal 700 of this invention has the same structure as and operates in the same way as conventional mobile communication terminals. For example, in a receiving process, a signal received by an antenna 701 is sent to a demodulation section 702 to perform demodulation such as RAKE reception and inverse diffusion. Then, a decoding section 703 performs decoding such as de-interleaving and turbo-decoding on the demodulated received signal. The encoded signal is converted into an analog voice signal through a voice codec section 704 and a D/A conversion section 705 and output from a speaker 706. On the other hand, a transmitting side performs the reverse process to the receiving side through a microphone 710, an A/D conversion section 709, the voice codec section 704, an encoding section 708, a modulation section 707, and the antenna 701. This configuration is also the same as that of conventional mobile communication terminals. Though not shown, the mobile communication terminal 700 further has a microprocessor for controlling the entire terminal, a baseband LSI for controlling radio communication channels, an input key, a liquid crystal display section and so on. The mobile communication terminal 700 may further has a packet communication processing section for performing data communication such as internet connection.

The first de-interleaver 100 of the present invention is used in the decoding section 703 of the mobile communication terminal 700. The use of the first de-interleaver 100 allows reduction of a buffer capacity required for first de-interleaving.

It is apparent that the present invention is not limited to the above embodiment that may be modified and changed without departing from the scope and spirit of the invention.

What is claimed is:

1. A de-interleaver, comprising:
   a data storage section having a plurality of data storage regions storing frames respectively, each of said frames including a plurality of data;
   a first storage section storing numbers, each of said numbers being defined for a corresponding one of said data storage regions
   a second storage section storing a permutation rule; and
   a control circuit coupled to said second storage section to retrieve data from each of said data storage regions according to said permutation rule,
   wherein said control circuit is further coupled to said first storage section to inhibit said retrieving of data from one of said data storage regions for a number of times, said number of times being determined responsively to one of said numbers corresponding to said one of said data storage regions.

2. The de-interleaver of claim 1, wherein said control circuit performs de-interleaving during said retrieving while the permutation rule associates a sequence of data bits stored in said storage regions before de-interleaving with a sequence of data bits after de-interleaving obtained by said control circuit.

3. The de-interleaver of claim 1, wherein said control circuit performs said retrieving as de-interleaving, and said control circuit determines a de-interleaved sequence of bits contained in the frames by referring to said numbers stored in said storage section.

4. A de-interleaver for de-interleaving frame data first-interleaved in a wideband code division multiple access (W-CDMA) system, comprising:
   a frame buffer having a plurality of storage regions storing frames respectively, each of said frames including a plurality of data;
   a first storage section table storing P bit information containing numbers, each of said numbers being defined for corresponding one of said frames;
   a second storage section storing a permutation rule; and
   a control section coupled to said second storage section to retrieve data from each of said data storage regions according to said permutation rule,
   wherein said control section is further coupled to said first storage section to inhibit said retrieving of data from one of said data storage regions for a number of times, said number of times being determined responsively to one of said numbers corresponding to said one of said data storage regions.

5. The de-interleaver of claim 4, wherein the control section performs said retrieving as de-interleaving, and the control section determines a de-interleaved sequence of bits contained in the frames by referring to said numbers stored in said first storage section.

6. A de-interleaver, comprising:

a frame buffer storing first and second frames having a plurality of data respectively, said first frame having a first data as one of said plurality of data included in said first frame, said second frame having a second data as one of said plurality of data included in said second frame;

a de-interleave unit coupled to said frame buffer and performing a de-interleaving process to output each of said plurality of data included in said first and second frames in a predetermined order and to generate a de-interleaved data sequence, said de-interleave unit outputting said first data and outputting said second data sequentially after said first data in said de-interleaving process;

an information storage unit storing an information indicating whether an additional data to be added to said first frame before performing said de-interleaving process exists or not; and wherein said de-interleave unit is further coupled to said information storage unit to output said second data without outputting said first data in said de-interleaving process in case that said information indicates that said additional data exists.

7. The de-interleaver according to claim 6, wherein said first data comprises a data to be output first among data in said first frame, and said second data comprises a data to be output first among data in said second frame.

8. The de-interleaver according to claim 6, wherein said information storage unit stores another information indicating whether another additional data to be added to said second frame before performing said de-interleaved process exists, and wherein said de-interleave unit does not output said second data in said de-interleaving process in a case that said another information indicates that said another additional data exists.

9. A de-interleaver, comprising:

an interface coupled to an information transmission path;

a frame buffer coupled to said interface to store first and second frames having a plurality of data respectively, said first frame having a first data as one of said plurality of data included in said first frame, said second frame having a second data as one of said plurality of data included in said second frame;

an information storage unit containing a control information indicating a predetermined order along which said data be de-interleaved; and a de-interleave unit coupled to said frame buffer and said information storage to perform a de-interleaving process to output each of said plurality of data included in said first and second frames in said predetermined order and to generate a de-interleaved data sequence, said predetermined order indicating said first data prior to said second data, wherein said de-interleave unit outputs said second data without outputting said first data in said de-interleaving process in response to receiving another control information from said interface indicating an absence of valid data in said first frame.

10. The de-interleaver of claim 9, further comprising:

another information storage unit storing said another control information indicating said absence corresponding to said first frame, wherein said de-interleave unit is further coupled to said information storage unit and said another information storage unit to refer said control information and said another control information in said de-interleaving process and to generate said de-interleaved data sequence.

* * * * *